United States Patent
Bergman

(10) Patent No.: US 7,163,588 B2
(45) Date of Patent: *Jan. 16, 2007

(54) PROCESSING A WORKPIECE USING WATER, A BASE, AND OZONE

(75) Inventor: Eric J. Bergman, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/005,495

(22) Filed: Dec. 6, 2004

(65) Prior Publication Data

US 2005/0133067 A1 Jun. 23, 2005

Related U.S. Application Data

(63) Continuation-in-part of application No. 09/621,028, filed on Jul. 21, 2000, now Pat. No. 6,869,487, which is a continuation-in-part of application No. PCT/US99/08516, filed on Apr. 16, 1999, which is a continuation-in-part of application No. 09/061,318, filed on Apr. 16, 1998, now abandoned, which is a continuation-in-part of application No. 08/853,649, filed on May 9, 1997, now Pat. No. 6,240,933.

(60) Provisional application No. 60/145,350, filed on Jul. 23, 1999.

(51) Int. Cl.
*B08B 3/00* (2006.01)
*B08B 3/04* (2006.01)
*B08B 3/10* (2006.01)

(52) U.S. Cl. ............... 134/2; 134/18; 134/19; 134/25.4; 134/26; 134/29; 134/33; 134/902; 134/30

(58) Field of Classification Search .......... 134/2, 134/18, 19, 25.4, 26, 29, 30, 33, 902
See application file for complete search history.

(56) References Cited

U.S. PATENT DOCUMENTS 4,064,885 A 12/1977 Dussault et al.

(Continued)

FOREIGN PATENT DOCUMENTS

DE 19801360 A1 7/1999

(Continued)

OTHER PUBLICATIONS

Alder, M., et al., "The Kinetics and Mechanism of Hydroxide Ion Catalyzed Ozone Decomposition in Aqueous Solution." J. Am. Chem. Soc., 72:1884-1886 (1950).

(Continued)

*Primary Examiner*—Zeinab El-Arini
(74) *Attorney, Agent, or Firm*—Perkins Coie LLP

(57) ABSTRACT

Contaminants such as photoresist are quickly removed from a wafer having metal features, using water, ozone and a base such as ammonium hydroxide. Processing is performed at room temperature to avoid metal corrosion. Ozone is delivered into a stream of process liquid or into the process environment or chamber. Steam may alternatively be used. A layer of liquid or vapor forms on the wafer surface. The ozone moves through the liquid layer via diffusion, entrainment, jetting/spraying or bulk transfer, and chemically reacts with the photoresist, to remove it.

19 Claims, 6 Drawing Sheets

U.S. PATENT DOCUMENTS

| | | | |
|---|---|---|---|
| 4,186,032 A | 1/1980 | Ham | |
| 4,633,804 A | 1/1987 | Arii | |
| 4,695,327 A | 9/1987 | Grebinski | |
| 4,749,440 A | 6/1988 | Blackwood et al. | |
| 4,778,532 A | 10/1988 | McConnell et al. | |
| 4,817,652 A | 4/1989 | Liu | |
| 4,899,767 A | 2/1990 | McConnell et al. | |
| 4,917,123 A | 4/1990 | McConnell et al. | |
| 4,974,530 A | 12/1990 | Lyon | |
| 5,032,218 A | 7/1991 | Dobson | |
| 5,039,349 A | 8/1991 | Schoeppel | |
| 5,055,138 A | 10/1991 | Slinn | |
| 5,063,609 A | 11/1991 | Lorimer | |
| 5,071,485 A | 12/1991 | Matthews et al. | |
| 5,105,556 A | 4/1992 | Kurokawa et al. | |
| 5,120,370 A | 6/1992 | Mori et al. | |
| 5,147,499 A * | 9/1992 | Szwejkowski et al. | 438/704 |
| 5,160,378 A | 11/1992 | Tuunanen et al. | |
| 5,181,985 A | 1/1993 | Lampert et al. | |
| 5,232,511 A | 8/1993 | Bergman | |
| 5,232,870 A | 8/1993 | Ito et al. | |
| 5,234,540 A | 8/1993 | Grant et al. | |
| 5,235,995 A | 8/1993 | Bergman et al. | |
| 5,244,000 A | 9/1993 | Stanford et al. | |
| 5,246,526 A | 9/1993 | Yamaguchi et al. | |
| 5,248,380 A | 9/1993 | Tanaka | |
| 5,308,745 A | 5/1994 | Schwartzkopf | |
| 5,326,406 A | 7/1994 | Kaneko et al. | |
| 5,366,757 A | 11/1994 | Lin | |
| 5,372,651 A | 12/1994 | Kodama | |
| 5,378,317 A | 1/1995 | Kashiwase et al. | |
| 5,415,191 A | 5/1995 | Mashimo et al. | |
| 5,423,944 A | 6/1995 | Wong | |
| 5,447,640 A | 9/1995 | Omi | |
| 5,464,480 A | 11/1995 | Matthews | |
| 5,503,708 A | 4/1996 | Koizumi et al. | |
| 5,518,542 A | 5/1996 | Matsukawa et al. | |
| 5,520,744 A | 5/1996 | Fujikawa et al. | |
| 5,571,367 A | 11/1996 | Nakajima et al. | |
| 5,626,769 A | 5/1997 | Sawamoto | |
| 5,632,847 A | 5/1997 | Ohno et al. | |
| 5,647,386 A | 7/1997 | Kaiser | |
| 5,658,615 A | 8/1997 | Hasebe et al. | |
| 5,705,089 A | 1/1998 | Sugihara et al. | |
| 5,714,203 A | 2/1998 | Schellenberger et al. | |
| 5,730,806 A | 3/1998 | Caimi et al. | |
| 5,749,975 A | 5/1998 | Li et al. | |
| 5,762,755 A | 6/1998 | McNeilly et al. | |
| 5,776,296 A | 7/1998 | Matthews | |
| 5,803,982 A | 9/1998 | Kosofsky et al. | |
| 5,810,940 A | 9/1998 | Fukazawa et al. | |
| 5,832,177 A | 11/1998 | Shinagawa et al. | |
| 5,845,662 A | 12/1998 | Sumnitsch | |
| 5,858,107 A | 1/1999 | Chao et al. | |
| 5,868,866 A | 2/1999 | Maekawa et al. | |
| 5,896,875 A | 4/1999 | Yoneda | |
| 5,911,836 A * | 6/1999 | Hada et al. | 134/2 |
| 5,911,837 A | 6/1999 | Matthews | |
| 5,916,366 A | 6/1999 | Ueyama et al. | |
| 5,922,624 A | 7/1999 | Verhaverbeke et al. | |
| 5,927,306 A | 7/1999 | Izumi et al. | |
| 5,944,907 A | 8/1999 | Ohmi | |
| 5,950,643 A | 9/1999 | Miyazaki et al. | |
| 5,964,952 A | 10/1999 | Kunze-Concewitz | |
| 5,964,954 A | 10/1999 | Matsukawa et al. | |
| 5,971,368 A | 10/1999 | Nelson et al. | |
| 5,975,098 A | 11/1999 | Yoahitani et al. | |
| 5,990,060 A | 11/1999 | Ohmi et al. | |
| 6,003,527 A | 12/1999 | Netsu et al. | |
| 6,030,932 A | 2/2000 | Leon et al. | |
| 6,085,764 A | 7/2000 | Kobayashi et al. | |
| 6,146,469 A | 11/2000 | Toshima | |
| 6,162,734 A | 12/2000 | Bergman et al. | |
| 6,199,567 B1 | 3/2001 | Kanno et al. | |
| 6,202,658 B1 | 3/2001 | Fishkin et al. | |
| 6,235,112 B1 | 5/2001 | Satoh | |
| 6,240,933 B1 | 6/2001 | Bergman | |
| 6,249,933 B1 | 6/2001 | Berfield | |
| 6,267,125 B1 | 7/2001 | Bergman et al. | |
| 6,273,108 B1 | 8/2001 | Bergman et al. | |
| 6,295,999 B1 | 10/2001 | Bran | |
| 6,299,696 B1 | 10/2001 | Kamikawa et al. | |
| 6,325,081 B1 | 12/2001 | Miki et al. | |
| 6,406,551 B1 | 6/2002 | Nelson et al. | |
| 6,423,146 B1 | 7/2002 | Fukazawa | |
| 6,431,184 B1 | 8/2002 | Taniyama | |
| 6,455,717 B1 | 9/2002 | Vaartstra | |
| 6,497,768 B1 | 12/2002 | Bergman | |
| 6,543,080 B1 | 4/2003 | Tomita et al. | |
| 6,551,409 B1 | 4/2003 | DeGendt | |
| 6,582,525 B1 | 6/2003 | Bergman | |
| 6,626,189 B1 | 9/2003 | Kashkoush et al. | |
| 6,743,301 B1 | 6/2004 | Matsuno et al. | |
| 6,758,938 B1 | 7/2004 | Torek | |
| 6,806,205 B1 | 10/2004 | Jang et al. | |
| 6,817,370 B1 | 11/2004 | Bergman et al. | |
| 6,843,857 B1 | 1/2005 | Bergman | |
| 6,869,487 B1* | 3/2005 | Bergman | 134/3 |
| 2002/0011257 A1 | 1/2002 | DeGendt | |
| 2002/0066464 A1* | 6/2002 | Bergman | 134/1 |
| 2004/0154641 A1 | 8/2004 | Montierth | |

FOREIGN PATENT DOCUMENTS

| | | |
|---|---|---|
| EP | 0 344 764 | 12/1989 |
| EP | 0 548 596 | 6/1993 |
| EP | 0 587 889 | 3/1994 |
| EP | 0 702 399 | 3/1996 |
| EP | 0 782 177 | 7/1997 |
| EP | 0 890 658 | 1/1999 |
| GB | 2 287 827 | 9/1995 |
| JP | 52-012063 | 4/1977 |
| JP | 52-100473 | 8/1977 |
| JP | 54-034751 | 3/1979 |
| JP | 59-068930 | 4/1984 |
| JP | 61-004232 | 1/1986 |
| JP | 62-117330 | 5/1987 |
| JP | 63-110732 | 5/1987 |
| JP | 63-016127 | 1/1988 |
| JP | 64-008630 | 1/1989 |
| JP | 64-042129 | 2/1989 |
| JP | 01-189921 | 7/1989 |
| JP | 01-192712 | 8/1989 |
| JP | 01-262627 | 10/1989 |
| JP | 03-041729 | 2/1991 |
| JP | 03-072626 | 3/1991 |
| JP | 03-208900 | 9/1991 |
| JP | 04-079221 | 3/1992 |
| JP | 04-125927 | 4/1992 |
| JP | 04-164324 | 6/1992 |
| JP | 04-298038 | 10/1992 |
| JP | 04-302144 | 10/1992 |
| JP | 04-302145 | 10/1992 |
| JP | 04-370931 | 12/1992 |
| JP | 05-013398 | 1/1993 |
| JP | 05-109686 | 4/1993 |
| JP | 05-136045 | 6/1993 |
| JP | 05-259139 | 10/1993 |
| JP | 05-283389 | 10/1993 |
| JP | 06-204130 | 7/1994 |
| JP | 07-155714 | 6/1995 |
| JP | 07-159980 | 6/1995 |
| JP | 08-008222 | 1/1996 |
| JP | 08-064566 | 3/1996 |

| | | |
|---|---|---|
| JP | 08-160032 | 6/1996 |
| JP | 08-288271 | 11/1996 |
| JP | 09-139345 | 5/1997 |
| JP | 10-144640 | 5/1998 |
| JP | 11-054427 | 2/1999 |
| JP | 2000-138188 | 5/2000 |
| WO | WO99/52654 | 10/1999 |
| WO | WO01/07177 A1 | 2/2001 |

OTHER PUBLICATIONS

Amick, J.A., "Cleanliness and the Cleaning of Silicon Wafers." Solid State Technology, pp. 47-52 (Nov. 1976).

Anantharaman, et al., "ORGANICS: Detection and Characterization of Organics in Semiconductor DI Water Processes." Ultrapure Water, pp. 30-36 (Apr. 1994).

Baumgärtner, H., et al., "Ozone Cleaning of the Si-SiO2 System." Appl. Phys. A, 43:223-226 (1987).

Bedge, S., et al., "Kinetics of UV/O2 Cleaning and Surface Passivation: Experiments and Modeling." Mat. Res. Soc. Symp. Proc., 259:207-212 (1992).

Bergman, E. et al., "HF-Ozone Cleaning Chemistry," Solid State Technology 46(7):115-124(2001).

Bolon, D.A., et al., "Ultraviolet Depolymerization of Photoresist Polymers," Polymer Engineering and Science, 12(2):108-111 (1972).

Christenson, K., et al., "Deionized Water Helps Remove Wafer Stripping 'Resist'-ance." www.precisioncleaningweb.com—Precision Cleaning Web—Archives, pp. 10-20 (Apr. 1998).

Egitto, F.D., et al., "Removal of Poly (Dimethylsiloxane) Contamination From Silicon Surfaces With UV/Ozone Treatment." Mat. Res. Soc. Symp. Proc., 385:245-250 (1995).

Gabriel, C., et al., "Reduced Device Damage Using An Ozone Based Photoresist Removal Process." SPIE Advances in Resist Technology and Processing VI, 1086:598-604 (1989).

Ganesan, G., et al., "Characterizing Organic Contamination in IC Package Assembly." The Int'l. Soc. for Hybrid Microelectronics, 17(2), Second Quarter, 152-160 (1994).

Golland, D.E., et al., "The Clean Module: Advanced Technology for Processing Silicon Wafers." Semiconductor Int'l., pp. 154-157 (Sep. 1987).

Goulding, M.R., "The selective epitaxial growth of silicon," Materials Science and Engineering, vol. B17, pp. 47-67 (1993).

Heyns, M.M., et al., "New Wet Cleaning Strategies for Obtaining Highly Reliable Thin Oxides." MRP Symposium Proceedings on Materials Research Society, Spring Meeting, San Francisco, CA, Apr. 12-13, p. 35 (1993).

Huynh, C., et al., "Plasma versus ozone photoresist ashing: Temperature effects on process-induced mobile ion contamination." J. Vac. Sci. Technol., B9(2):353-356 (Mar./Apr. 1991).

Isagawa, T., et al., "Ultra Clean Surface Preparation Using Ozonized Ultrapure Water." Extended Abstracts of the 1992 Int'l. Conf. on Solid State Devices and Materials, pp. 193-195 (1992).

Kasi, S., et al., "Surface Hydrocarbon Removal from Si by UV/Ozone." ECS Extended Abstracts, No. 458, pp. 691-692 (1990).

Kasi, S., et al., "Vapor phase hydrocarbon removal for Si processing." Appl. Phys. Lett., 57(20):2095-2097 (Nov. 1990).

Kern, W., "The Evolution of Silicon Wafer Cleaning Technology." J. Electrochem. Soc., 137(6):1887-1892 (Jun. 1990).

Krusell, W.C., et al., "The Characterization of Silicon Substrate Cleaning Treatments by use of SIMS and MOS Electrical Testing." ECS Extended Abstracts, No. 229, p. 331-332 (1986).

Krusell, W.C., et al., "Cleaning Technologies for High Volume Production of Silicon Wafers." ECS Proc. of the First Int'l. Symposium on Cleaning Technology in Semiconductor Device Mfg., pp. 23-32 (Oct. 1989).

Nelson, S., "Ozonated water for photoresist removal." Solid State Technology, p. 107-112 (Jul. 1999).

Ohmi, T., et al., "Native Oxide Growth and Organic Impurity Removal on Si Surface with Ozone-Injected Ultrapure Water." J. Electrochem. Soc., 140(3):804-810 (Mar. 1993).

Sehested, K., et al., "Decomposition of Ozone in Aqueous Acetic Acid Solutions (pH 0-4)." J. Phys. Chem., pp. 1005-1009 (1992).

Shimada, H., et al., "Residual-Surfactant-Free Photoresist Development Process." J. Electrochem., Soc., 139(6):1721-1730 (Jun. 1992).

Suemitsu, M., et al., "Low Temperature Silicon Surface Cleaning by HF Etching/Ultraviolet Ozone Cleaning (HF/UVOC) Method (I)- Optimization of the HF Treatment." Japanese Journal of Applied Physics, 28(12):2421-2424 (Dec. 1989).

Tabe, M., "UV ozone cleaning of silicon substrates in silicon molecular beam epitaxy." Appl. Phys. Lett., 45(10):1073-1075 (Nov. 1984).

Tong, J., et al., "Aqueous Ozone Cleaning of Silicon Wafters." ECS Extended Abstracts, Phoenix, AZ, Abstract No. 506, pp. 753 (Oct. 13-17, 1991).

Tong, J., et al., "Aqueous Ozone Cleaning of Silicon Wafers." Proc. of 2.sup.nd Int'l. Symposium on Cleaning Tech. In Semiconductor Device Mfg., pp. 18-25 (Oct. 1992).

Vig, J., "UV/Ozone Cleaning of Surfaces." U.S. Army Elec. Tech. and Devices Lab., pp. 1-26.

Vig, J., "UV/Ozone Cleaning of Surfaces: A Review." Surface Contamination: Genesis, Detection, and Control, pp. 235-253 (1979).

Vig, J., et al., "UV/Ozone Cleaning of Surfaces." IEEE Transactions on Parts, Hybrids, and Packaging, vol. PHP-12(4):365-370 (Dec. 1976).

Vig, J., "UV/Ozone Cleaning of Surfaces." U.S. Army Electronics Technology and Devices Laboratory, ERADCOM, Ft. Monmouth, NJ, 07703-5302, pp. 1027-1034 (Sep./Oct. 1984).

Zafonte, L., et al., "UV/Ozone Cleaning For Organics Removal on Silicon Wafers." SPIE Optical Microlithography III: Technology for the Next Decade, 470:164-175 (1984).

Zazzera, L.A., et al., "XPS and SIMS Study of Anhydrous HF and UV/Ozone-Modified Silicon (100) Surfaces." J. Electrochem. Soc., 136(2):484-491 (Feb. 1989).

"Ozone Concentration Measurement on a Process Gas." Proposed IOA Pan American Group Guideline, pp. 1-21 (Dec. 1993).

"Ozone for Semiconductor Applications." Sorbios, pp. 1-6 (Oct. 1991).

* cited by examiner

PROCESSING A WORKPIECE USING WATER, A BASE, AND OZONE

This Application is a Continuation-in-Part of U.S. patent application Ser. No. 09/621,028, filed Jul. 21, 2000 and now U.S. Pat. No. 6,869,487 and incorporated herein by reference, which is a Continuation-in-Part of U.S. Patent Application Ser. No. PCT/US99/08516, filed Apr. 16, 1999, which is a Continuation-in-Part of U.S. patent application Ser. No. 09/061,318, filed Apr. 16,1998 and now abandoned, which is a Continuation-in-Part of U.S. patent application Ser. No. 08/853,649, filed May 9, 1997, now U.S. Pat. No. 6,240,933. U.S. patent application Ser. No. 09/621,028 is also a Continuation-in-Part of U.S. patent application Ser. No. 60/145,350, filed Jul. 23, 1999.

FIELD OF THE INVENTION

Semiconductor devices are the basic building blocks of most electronic products. They are widely used in almost all consumer electronic products, such as cell phones, computers, televisions, etc. as well as in communications, medical, industrial, military, and office products and equipment. Semiconductor devices are manufactured from semiconductor wafers. The cleaning of semiconductor wafers is a critical step in the manufacturing semiconductor devices. The semiconductor devices on wafers are microscopic, often fractions of a micron, while the film thicknesses may be on the order of 20 Angstroms. This makes the devices manufactured from the wafers highly susceptible to performance degradation or failure due to even the tiniest amounts of organic, particulates or metallic/ionic contamination.

For many years, wafers were cleaned in typically three or four separate steps using strong acids, such as sulfuric acid, and using strong caustic solutions, such as mixtures of hydrogen peroxide or ammonium hydroxide. These are highly reactive and toxic chemicals. While these methods achieved varying degrees of success, they had certain disadvantages, including the high cost of the process chemicals, the relatively long time required to get wafers through the various cleaning steps, high consumption of water due to the need for extensive rinsing between chemical steps, and high disposal costs. As a result, extensive research and development efforts have been made not only in the United States, but also in Europe and in Japan, to find better wafer cleaning techniques.

Several years ago, after extensive research, the Inventor developed a revolutionary new process for cleaning wafers, using ozone and heated water or water vapor. In recognition of this breakthrough achievement, the U.S. Patent and Trademark Office awarded the Inventor several pioneering U.S. Patents on his ozone and water process. The ozone and water process is now widely used in the semiconductor industry. This ozone and water process has proven to be remarkably effective in rapidly cleaning contamination and organic films off of wafers, while avoiding many of the disadvantages of the older methods using acids and caustics. Among the advantages of the ozone and water process is that it is fast, and requires no expensive and toxic liquid acids or caustics. It can also operate effectively as a spray process, which greatly reduces water consumption and space requirements.

The water and ozone process can be performed in various ways. In one form of the process, ozone gas diffuses through a thin layer of heated water or water vapor on the wafers. The water and ozone can be applied in various ways. These include spraying water onto the workpiece while injecting ozone into the water, spraying water on the workpiece while separately delivering ozone to the workpiece or delivering a combination of steam or water vapor and ozone to the workpiece. Spray techniques using hot water have been especially successful at increasing the removal rates of various organic films and contaminants from workpiece surfaces.

One advantage of the water and ozone process is that it is generally carried out at temperatures above room temperature. This provides for faster processing or cleaning, because the chemical reactions between the layer, film or contaminants to be removed, and the water and ozone, occur faster at higher temperatures. However, notwithstanding the phenomenal success of the water and ozone process, some disadvantages have remained in highly unique and specialized applications, such as in removing certain types of photoresist, or in processing workpieces having features of certain metals, such as NiCr or silver. With additional research and testing, the Inventor has now overcome the disadvantages of using the water and ozone process in these applications as well.

SUMMARY OF THE INVENTION

A novel wafer cleaning solution, application technique, system, and methods are used to speed up processing in the manufacturing of semiconductor wafers, memory disks, photomasks, optical media, and on other substrates which microelectronic, micromechanical, or micro-electromechanical devices can be or are formed (collectively referred to here as "workpieces" or "wafers").

Wafers are processed or cleaned by applying a chemical stream to the wafer surface. Ozone is delivered either into the liquid stream or into the environment around the wafer. The chemical stream, which may be in the form of a liquid or vapor, can be applied to the wafer via spraying, immersion, bulk transfer, flowing, etc. In general, a liquid layer is formed and the thickness of the liquid layer is controlled. The chemical stream may include ammonium hydroxide. The Inventor has discovered that ammonium hydroxide is surprisingly effective in removing certain photoresists. He has also discovered that when used with the water and ozone methods, ammonium hydroxide reduces corrosion of certain metals used on wafers. These discoveries now allow the novel water and ozone process to be used on more different kinds of wafers.

In one aspect of the invention, the chemical stream is a processing liquid. The liquid may be heated and applied onto the wafer surface. Heating speeds up the process. The processing solution is formed into a thin liquid layer on the wafer surface. The thickness of the liquid layer is advantageously controlled through the use of one or more of the rotation rate, the flow rate of the processing solution, and/or the injection technique (nozzle design) used to deliver the liquid (or steam) stream to the surfaces of the wafers.

Ozone chemically reacts with the contaminant to be removed. The contaminant may be a film or layer intentionally applied to the wafer in an earlier manufacturing step, such as photoresist. Alternatively, the contaminant may be undesirable particles or residues or films that get onto or form on the wafer during the manufacturing process. Both types are referred to here as contaminants. The ozone is brought into contact with the contaminants by diffusion through a liquid layer on the wafer, by bulk transfer, via jetting or spraying, by entrainment or dissolution in a liquid stream, or in other ways.

Heated water vapor or steam can be used instead of or in addition to liquid. With steam, it is possible to achieve wafer surface temperatures well over 100° C., thereby further accelerating the processing or cleaning chemical reactions. A steam generator may be used to pressurize the process chamber to achieve the desired temperatures. The increased pressure within the processing chamber can also provide for use of higher ozone concentrations, thereby further speeding up processing. The rate of oxidation provided by the ozone may also be improved by irradiating the surfaces of the wafers with ultra-violet light.

The water and ozone process, when run at higher temperatures, is very fast and efficient in removing contaminants, such as photoresist. However, some wafers may have metal features or surfaces that are corroded by hot water. To avoid corrosion, these wafers are typically run at lower temperatures. However, this slows processing in general. And with some types of photoresist, the strip or etch rate of water and ozone process at lower temperatures becomes especially slow. The Inventor has now discovered that using ammonium hydroxide with the water and ozone process quickly and completely removes photoresist, even at lower temperatures. As a result, the water and ozone process can now be used on wafers having metals that are otherwise subject to corrosion.

The invention resides as well in sub-combinations of the methods, and apparatus described.

DETAILED DESCRIPTION

A wafer is processed or cleaned via ozone diffusing through an aqueous layer or in an aqueous vapor/gas environment, to oxidize contaminants. Additives in the aqueous layer enhance or enable the desired etching action, such as removal of films or layers including photoresist, germanium, hafnium, copper, aluminum, titanium, tungsten, nichrome, silicon dioxide, and silicon films or layers. Use of ammonium hydroxide or other bases, in the water and ozone process, allows the process to remove even very hardened photoresists. Use of bases with the water and ozone process also provides for very fast removal of photoresists from wafers having metal surfaces or features, while at room temperature, to avoid metal corrosion.

Figure 1:
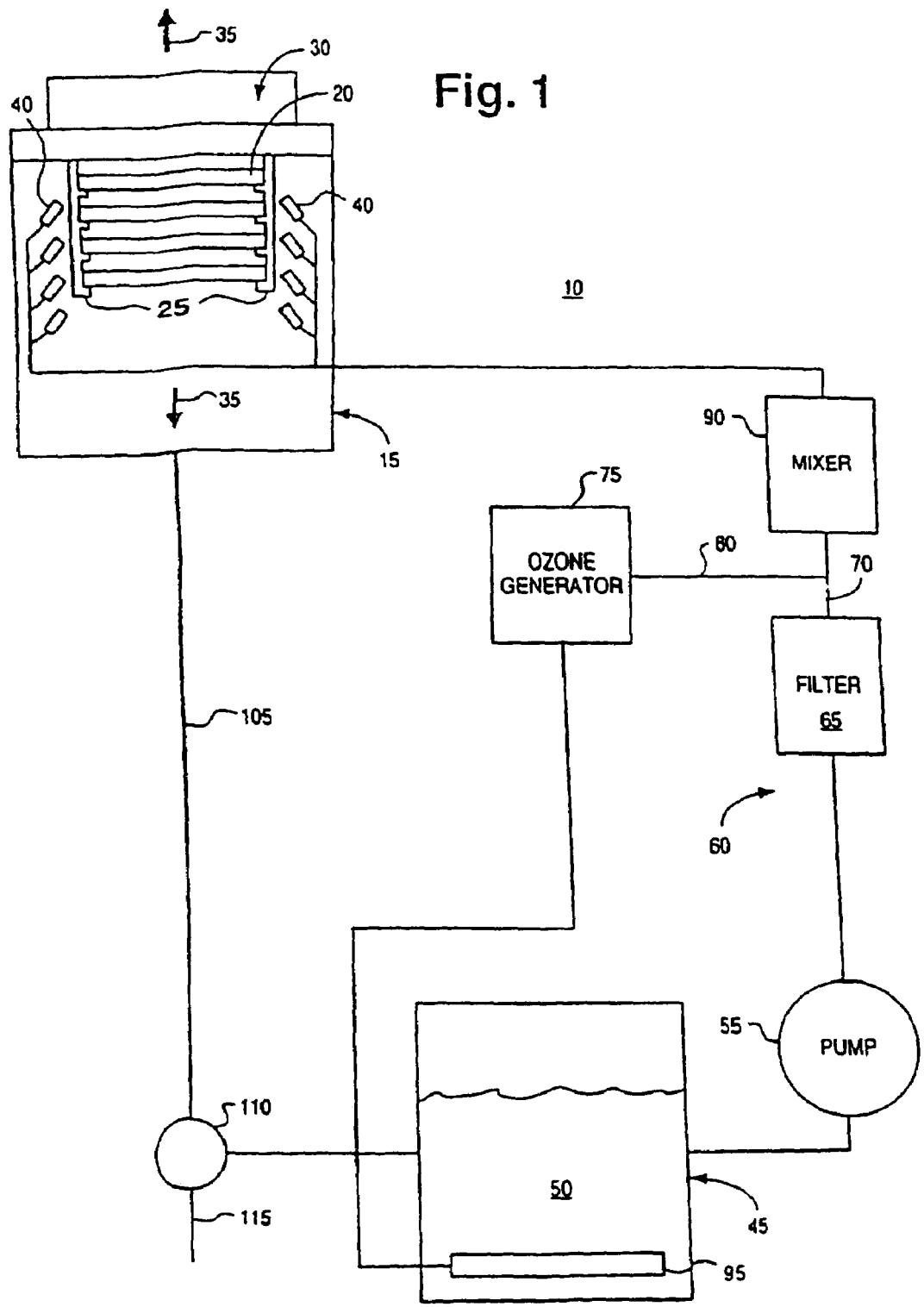
FIG. 1 is a diagram of one embodiment of an apparatus for cleaning a workpiece in which ozone is injected into a line containing a pressurized liquid.

Referring to FIG. 1, a system 10 includes a process chamber 15 that can hold one or more workpieces 20, such as semiconductor wafers. Although the illustrated system is primarily directed to a batch workpiece apparatus, it is readily adaptable for use in single workpiece processing as well. The workpieces 20 are preferably supported within the chamber 15 by one or more supports 25 extending from, for example, a rotor assembly 30. Rotor assembly 30 may seal with the housing of the process chamber 15 to form a closed processing environment. Alternatively, a door may close off or seal the chamber. The rotor assembly 30 spins the workpieces 20 about axis 35 during, and/or after process with the ozone and process liquid. The chamber 15 has a volume which is as small as permitted by design considerations for any given capacity (i.e., the number and size of the wafers to be cleaned). The chamber 15 is preferably cylindrical for processing multiple wafers in a batch. A flatter disk-shaped chamber may be used for single wafer processing. Typically, the chamber volume will range from about 2–8, 3–6, or 5 liters, (for a single wafer) to about 10–80, 20–70, 30–60, or 50 liters (for a 50 wafer system).

One or more nozzles 40 in the process chamber 15 direct a spray of ozone and process liquid onto the surfaces of the wafers 20. The spray may be directed to the upper surface of the workpiece 20 or the lower surface (or both). The liquid may also be applied in other ways besides spraying, such as flowing, bulk deposition, immersion, etc. A pump 55 provides the liquid under pressure along a flow path, shown generally at 60, for ultimate supply to the input of the nozzles 40. The liquid is at ambient temperature, e.g., 15–30° C. Most often, the process liquid used is deionized water. Other process fluids, such as other aqueous or non aqueous solutions, may also be used.

The flow path 60 may include a filter 65 to filter out microscopic contaminants from the process liquid. Ozone is injected along fluid flow line 70. The ozone is generated by ozone generator 75. It is supplied along fluid flow line 80 under pressure to fluid flow line 70. Optionally, the process liquid, now injected with ozone, is supplied to the input of a mixer 90 that mixes the ozone and the process liquid. The mixer 90 may be static or active. From the mixer 90, the process liquid and ozone are provided to be input of nozzles 40. The nozzles spray the liquid on the surface of the workpieces 20. Ozone is also introduced into the process chamber 15 from the nozzles.

To further concentrate the ozone in the process liquid, an output of the ozone generator 75 may be supplied to a dispersion unit 95 in the reservoir 45. The dispersion unit 95 provides a dispersed flow of ozone through the process liquid to thereby add ozone to the fluid stream prior to injection of a further amount of ozone along the fluid path 60.

In the embodiment of FIG. 1, spent liquid in the chamber 15 is provided along fluid line 105 to, for example, a valve mechanism 110. The valve mechanism 110 may be operated to provide the spent liquid to either a drain output 115 or back to the liquid chamber 50 of the reservoir 45. Repeated cycling of the process liquid through the system and back to the reservoir 45 assists in elevating the ozone concentration in the liquid through repeated ozone injection and/or ozone dispersion.

FIG. 1, (as well as the other Figures) illustrates various components and connections. While showing preferred designs, the drawings include elements which may or may not be essential to the invention. The elements essential to the invention are set forth in the claims. The drawings show both essential and non-essential elements.

Figure 2:
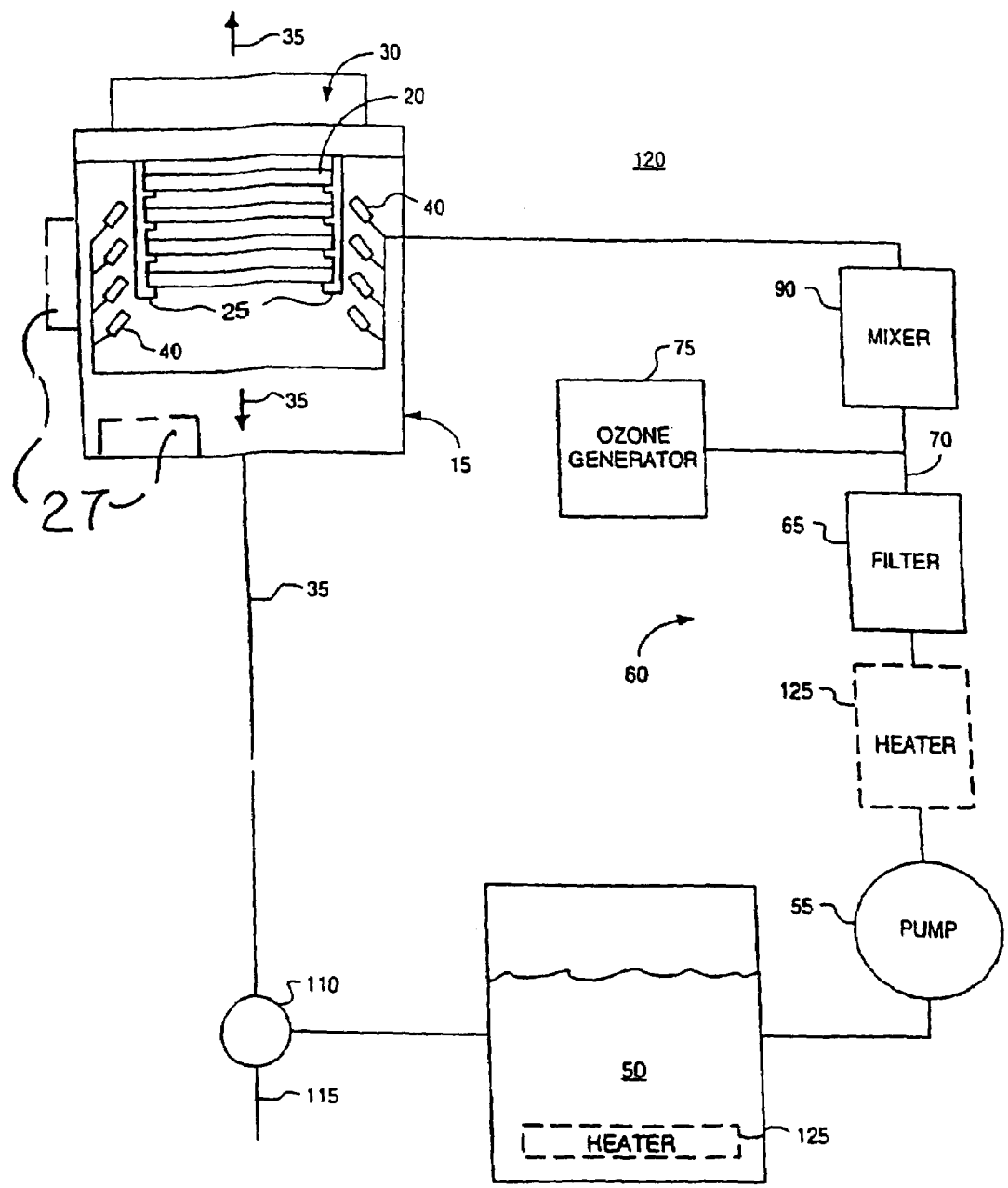
FIG. 2 is a diagram of one embodiment of an apparatus for cleaning a workpiece in which the workpiece is indirectly heated by heating a liquid that is sprayed on the surface of the workpiece.

Another system 120 shown in FIG. 2 involves heating the surfaces of the workpieces 20 with a heated liquid that is supplied along with a flow of ozone. The system 120 optionally includes one or more heaters 125 used to heat the process liquid. The workpieces can also be heated directly via conduction heaters. Such heating may take place in addition to or instead of the indirect heating of the workpieces through contact with the heated process liquid. For example, supports 25 may include heating elements that may be used to heat the workpieces 20. The chamber 15 may optionally include a heater 27, inside or outside of the chamber.

Figure 3:
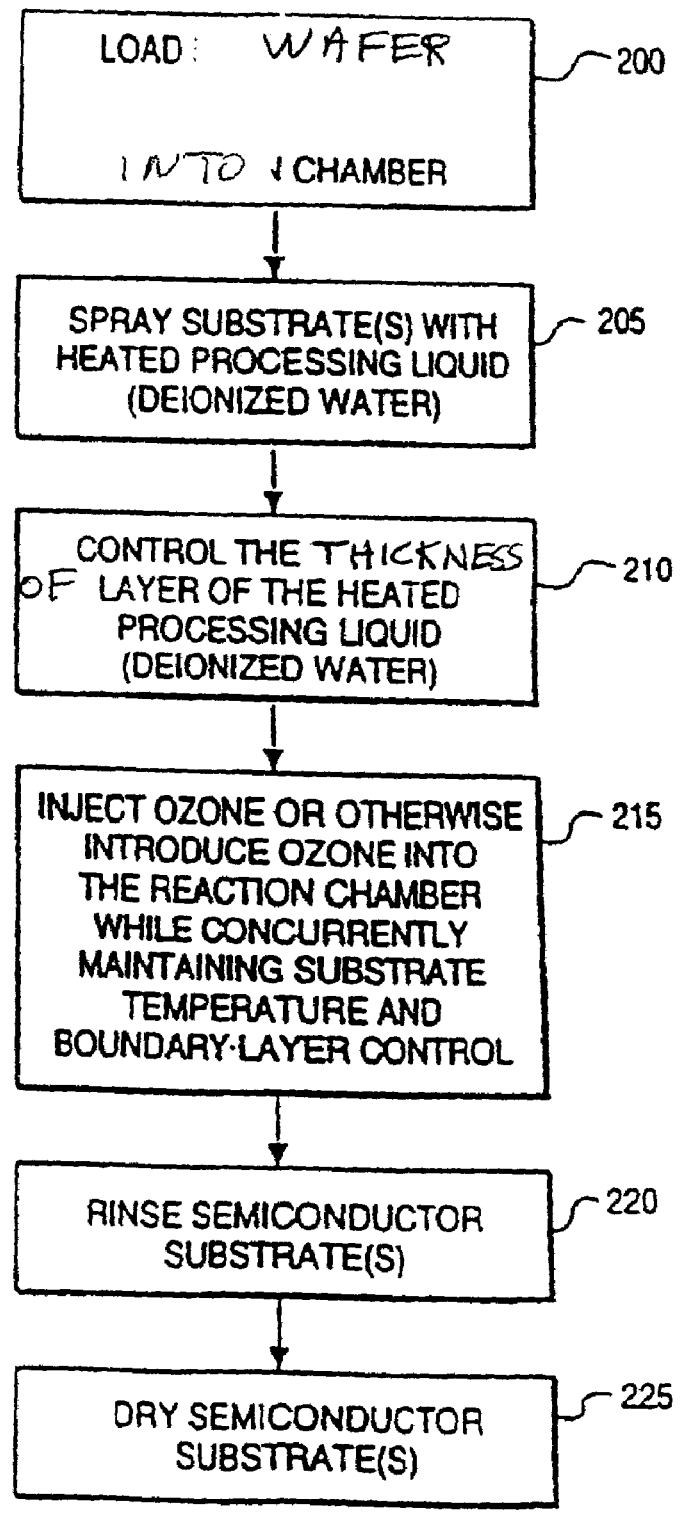
FIG. 3 is a flow diagram illustrating one embodiment of a process flow for cleaning a workpiece with a fluid and ozone.

FIG. 3 illustrates a process that may be performed in the system of FIG. 2 when the system 120 is used, for example, to strip photoresist from the surfaces of wafers. At step 200, the wafers 20 are placed in, for example, a wafer cassette or carrier. This cassette is placed in a closed environment, such as in chamber 15. Alternatively, the workpieces 20 may be disposed in chamber 15 in a carrierless manner, with an automated processing system, such as described in U.S. Pat. No. 5,784,797.

At step 205, heated deionized water is sprayed onto the surfaces of the workpieces 20. The heated deionized water heats the surfaces of the workpieces 20 as well as the enclosed environment of the chamber 15. When the spray is discontinued, a thin liquid film remains on the workpiece surfaces. If the surface is hydrophobic, a surfactant may be added to the deionized water to assist in creating a thin liquid layer on the workpiece surfaces. The surfactant may be used with hydrophilic surfaces as well. Corrosion inhibitors may also be used with the aqueous ozone, thin liquid layer process.

The thickness of the liquid layer is controlled at step 210 using one or more techniques. By reducing the liquid layer thickness, the ozone is better allowed to diffuse to the wafer surface where it reacts with and removes contaminants. The workpieces 20 may be rotated about axis 35 by rotor 30 to thereby generate centrifugal force that thins the liquid layer. The flow rate of the liquid (or vapor) may also be used to control the thickness of the liquid layer. Lowering the flow rate results in decreased liquid layer thickness. Nozzles 40 may be designed to provide the deionized water as micro droplets thereby resulting in a thin liquid layer. Hence, rotating the wafer is not essential.

At step 215, ozone is injected into the fluid flow path 60 during the water spray, or otherwise provided to the internal chamber environment of chamber 15. If the apparatus of FIG. 2 is utilized, the injection of the ozone continues after the spray has shut off. If the wafer surface begins to dry, a brief spray is preferably activated to replenish the liquid film. This keeps the wafer wet. It also helps keep the wafer at the desired elevated temperature. The liquid layer thickness may range from a few molecular layers (e.g., about 1 micron), up to 100 microns, (typically 50–100 microns), or greater.

While ozone has a limited solubility in the heated deionized water, the ozone is able to diffuse through the water and react with photoresist at the liquid/photoresist interface. The deionized water appears to assist in the reactions by hydrolyzing the carbon-carbon bonds of molecules of organic contaminants, such as photoresist. The higher temperature speeds up the chemical reaction cleaning, while the high concentration of ozone in the gas phase promotes diffusion of ozone through the liquid layer even though the liquid layer may not actually have a high concentration of dissolved ozone.

Elevated or higher temperatures means temperatures above ambient or room temperature, that is temperatures above 20 or 25° and up to about 200° C., with typical temperatures ranging from 25–150°; 55–120°; 75–115° C., or 85–105° C. In the specific methods described, temperatures of 90–100° C., may be used. With temperatures above 100 C, liquid is used in a pressurized chamber, or steam may be used. Use of lower temperatures (between 25 and 75° C. and preferably from 25–65° C. (rather than at e.g., 95° C. as described above) may be useful where higher temperatures are undesirable. Still lower temperatures, e.g., 15–25° C., may be used to avoid corrosion, as described below.

After processing, the wafers may be rinsed at 220 and are dried at step 225. For example, the workpieces may be sprayed with a flow of deionized water during the rinse at step 220. They may then be subject to any one or more known drying techniques thereafter at step 225.

To conserve water and achieve a very thin liquid layer, a "pulsed flow" of liquid or steam may be used. If the "pulsed flow" cannot maintain the desired elevated wafer surface temperatures, heaters 27, for example, one or more embedded heated recirculating coils, a heating blanket, or irradiation from a thermal source (e.g., an infrared lamp), etc. may be used.

Corrosion of metal features, areas or films on a wafer may occur if the metal films are exposed to high temperature de-ionized water. This situation may arise with back end of the line (BEOL) wafers, i.e., wafers which have already been plated or otherwise provided with metal layers. These types of wafers have therefore been processed at lower or at ambient temperatures, to avoid corrosion. However, in the past, at low or ambient temperatures, fast strip rates generally could not be achieved with the water and ozone processes. In some cases, faster strip rates could sometimes still be achieved by using increased ozone flow rates and concentrations. Nevertheless, wafers subject to metal corrosion have generally required more time, as they necessarily have been cleaned at lower temperatures.

Ammonium hydroxide has now also been discovered to be advantageous in performing the water and ozone process at lower temperatures. More specifically, the Inventor has discovered that ammonium hydroxide enables stripping of certain photoresists at ambient temperature, which otherwise are not removed satisfactorily using the water and ozone process. Testing shows that one or more components of photoresist (for example Shipley 712, Shipley 718 and Shipley 1815 photoresist) are not readily stripped at room temperature. With these and other similar photoresists, a residual film of photoresist remains on the wafer, when processed at room temperature. While the bulk of the photoresist layer (the bulk photoresist layer) may be reduced from e.g., 18,000 or 14,000 A to 2000 A in less than about 4, 5 or 6 minutes (when using the water and ozone process at room temperature), the final film or residue having a thickness of e.g., 3000 A, 2000 A, or 1000 A may take in the range of 10–30, 12–25, 15 or 20 minutes longer (sometimes even more) to be removed. The addition of ammonium hydroxide during the water and ozone process enables complete removal of all photoresist in about 3:00 to 15:00; 4:00 to 12:00; 5:00 to 10:00 or 6:00 to 8:00 minutes.

The same result can also be achieved via immersion. Immersing a wafer in very dilute solutions of ammonia will remove photoresist film or residue. Diluting a 30% (weight) solution of NH3 in water to the following concentrations enabled removal of the 2000 A residue in the following times:

| Test | H₂O:NH3 (30% wt.) Dilution | Residue removal Time (minutes:seconds) |
|---|---|---|
| 1 | 2000:1 | <0:15 |
| 2 | 10,000:1 | 0:30 |
| 3 | 20,000:1 | 1:00 |
| 4 | 40,000:1 | 1:45 |
| 5 | 80,000:1 | 3:00 |
| 6 | 100,000:1 | 3:00 |
| 7 | 160,000:1 | >6:00 |

A 30% (weight) solution of $NH_3$ results in a 60% solution of water and $NH_4OH$. Volume ratios and weight percent ratios for $NH_4OH$ can be calculated directly from the data listed above. As shown, use of even extremely dilute $NH_4OH$ can enable the removal of photoresist and subsidiary components of photoresist even at ambient temperatures.

Other additives may be used instead of ammonium hydroxide for removing photoresist or other organic contaminants. The principal goal of the additive is to elevate the pH of the solution that is applied to the wafer surface. The pH should be raised so that it is between about 8.5 and 11. Although bases such as sodium hydroxide and/or potassium hydroxide may be used here, TMAH (tetra-methyl ammonium hydroxide) may be even better in some cases because it avoids concerns over mobile ion contamination. Ionized water that is rich in hydroxyl radicals may also be used. HF and/or HCl may be used as additives for removal of organic contaminants, particles and/or metals, or for removal of oxide and regeneration of a controlled chemical oxide.

The dilute ammonium hydroxide solution may be applied in the photoresist removing process in various ways. For example, syringe pumps, or other precision chemical applicators, can be used to enable single-use of the solution stream. Photoresist may be stripped or cleaned away by using a deionized water stream with ozone, and can conclude the strip with a brief period during which ammonium hydroxide is injected into the aqueous stream. This assists in minimizing chemical usage and waste generation. The system may optionally monitor and control the pH the using the appropriate sensors and actuators, for example, by use of microprocessor control.

Ammonium hydroxide has also been found to be especially advantageous in stripping negative photoresist. Testing has shown that the water and ozone process (using hot water) removed negative photoresist in about one hour. The addition of a 30% (wt. NH3 in $H_2O$) solution of $NH_4OH$ to the water at a dilution ratio of 2000:1 decreased the strip time by roughly 60%, to about 20:00 minutes. This also proved to be successful in stripping a negative photoresist which had been implanted with boron at 100 KeV and a dosage of 1E16 atoms/cm2. Previously, the water and ozone process had not been successful in removing positive photoresist implanted at dosages above about 4E14 atoms/$cm^2$.

Test results show also that silicon wafers can be processed using a 4:1 water: ammonium hydroxide solution at 95C and experience an increase surface roughness (RMS) of less than 2 angstroms. When this same solution is applied in an immersion system or in a conventional spray system, RMS surface roughness as measured by atomic force microscopy increases by more than 20 angstroms and the maximum surface roughness exceeds 190 angstroms. Additionally, while a conventional process will pit the surface to such a degree as to render the surface unreadable by a light-scattering particle counter, the water with ammonium hydroxide and ozone process has actually shown particle reductions of up to 50% on the wafer surface.

Aluminum, Al/Si, Al/Cu and Al/Si/Cu alloys are commonly used in the semiconductor industry. However, the water and ozone process can attack these metal films, especially if a galvanic potential is established between these metals and some other metal or doped regions on the wafer surface. To run the water and ozone process at high temperatures and at high strip rates, without substantial corrosion of these metals, certain corrosion inhibitors can be used. These include nitrates, especially aluminum nitrate and ammonium nitrate. These corrosion inhibitors are used at concentrations in the range of 0.5 to 5 or 1 to 3 grams per liter. Benzotriazole and sodium orthosilicate may also be used. While some inhibitors are preferred over others, due to concerns over metal or mobile ion contamination, these corrosion inhibitors may be used singly or in combinations with each other to control corrosion. Phosphates may be used on silver and copper films, and sulfates used on silver as well.

Nickel chromium (NiCr) is a metal which may be used on wafers. While either Ni or Cr alone show significant corrosion resistance to the water and ozone process even at temperatures up to 95C, the alloy of NiCr is surprisingly completely corroded or removed by the water and ozone process, even when run at ambient temperature. However, when ammonium hydroxide is added to the water at ambient temperature (e.g., 15–30° C.), the corrosion is eliminated. Ammonia dilutions in the range of 20:1 (starting with a 30% weight solution of ammonium hydroxide) have been successful. The use of ammonium hydroxide is also useful in reducing corrosion on silver. Ammonium hydroxide may also be added to the process liquid (e.g., deionized water) to reduce particle counts on the wafers, with the ozone preventing pitting of the silicon surface by the ammonium hydroxide.

The water and ozone process alone has been shown to provide etch capability on certain films, including metal films such as aluminum and alloys of aluminum as well as silver, copper, tungsten, germanium, germanium/silicon, titanium, and nichrome. In addition, additives such as ammonium hydroxide can be used to enhance this etch capability, as well as provide etch capability on films such as thermal (silicon di-) oxide, TEOS, etc. These oxides are generally not attacked by the water and ozone process. However, the lack of oxide etch may cause a parametric shift in certain devices which have been optimized as regards to processes such as ammonium hydroxide hydrogen peroxide mixtures (APM) which do remove small amounts of oxide. The water and ozone process with 2000:1 ammonia will etch thermal oxide at around 0.4 to 0.8 A/minute. While the etch is significantly less than the APM process, it can be boosted by increasing the ammonia concentration in order to comply better with device requirements.

Continuing now with FIG. 3, steps 205–215 may be executed in a substantially concurrent manner. Steps 205–215 may be sequentially repeated using different processing liquids. In such instances, each of the processing liquids that are used may be specifically tailored to remove a respective set of contaminants. Preferably, however, it is desirable to use as few different processing liquids as possible. By reducing the number of different processing liquids utilized, the overall cleaning process is simplified and reducing the number of different processing liquids utilized minimizes chemical consumption.

It has been found that the process of FIG. 3 may be used with a processing liquid comprised of water and ammonium hydroxide to remove photoresist (and any anti-reflective coating) in a single processing step (e.g., the steps illustrated at 210–215). Although this has been demonstrated at concentrations between 0.02% and 0.04% ammonium hydroxide by weight in water, other concentrations may be used.

Figure 4:
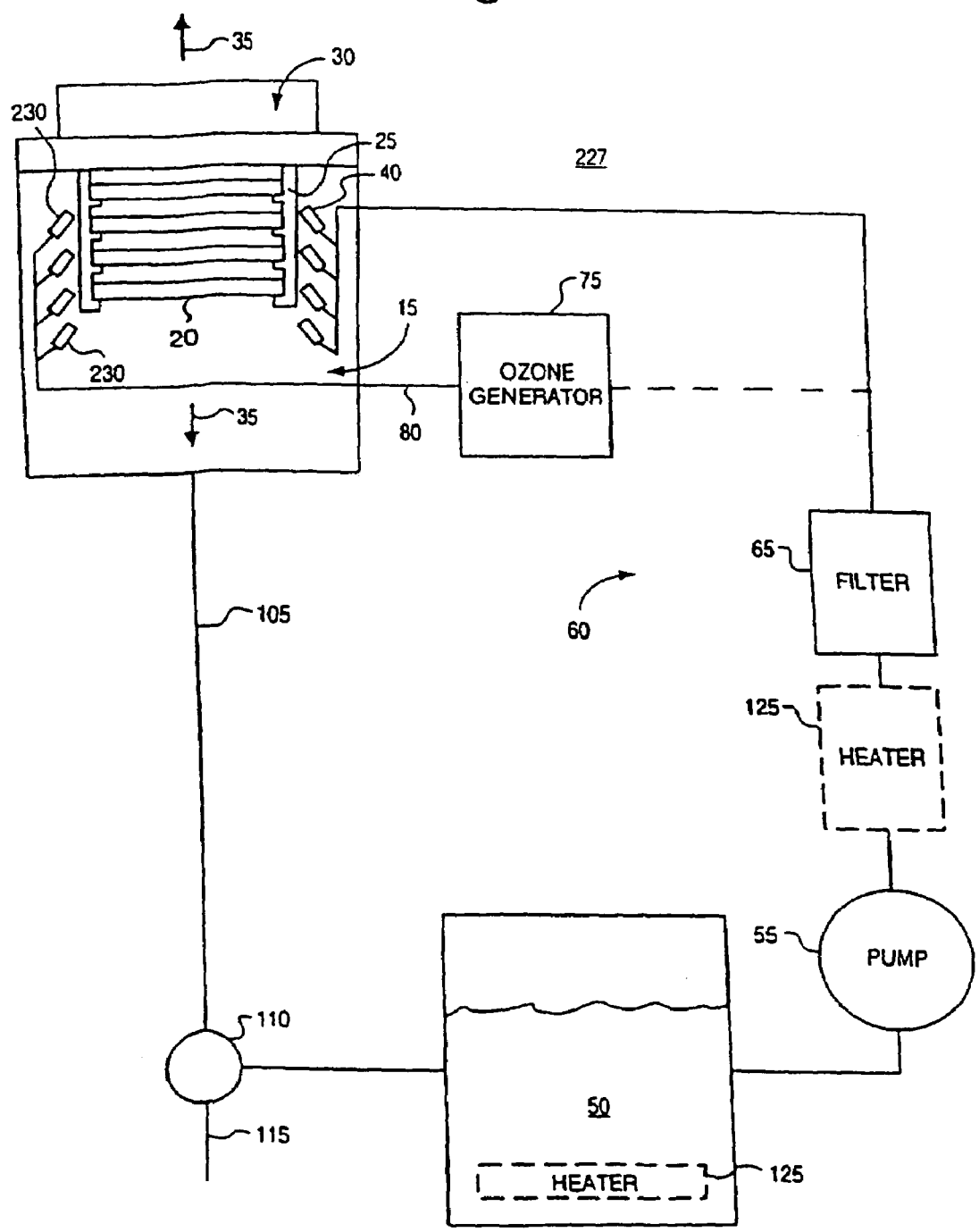
FIG. 4 is a diagram of an alternative embodiment of the system set forth in FIG. 2 wherein the ozone and fluid are provided to the workpiece along different flow paths.

In the embodiment of FIG. 4, a system 227 has one or more nozzles 230 within the chamber 15 to provide ozone from ozone generator 75 directly into the chamber. The heated liquid is provided to the chamber 15 through nozzles 40. The liquid supply line is separate from the ozone supply line. Injection of ozone in fluid path 60 is optional.

Figure 5:
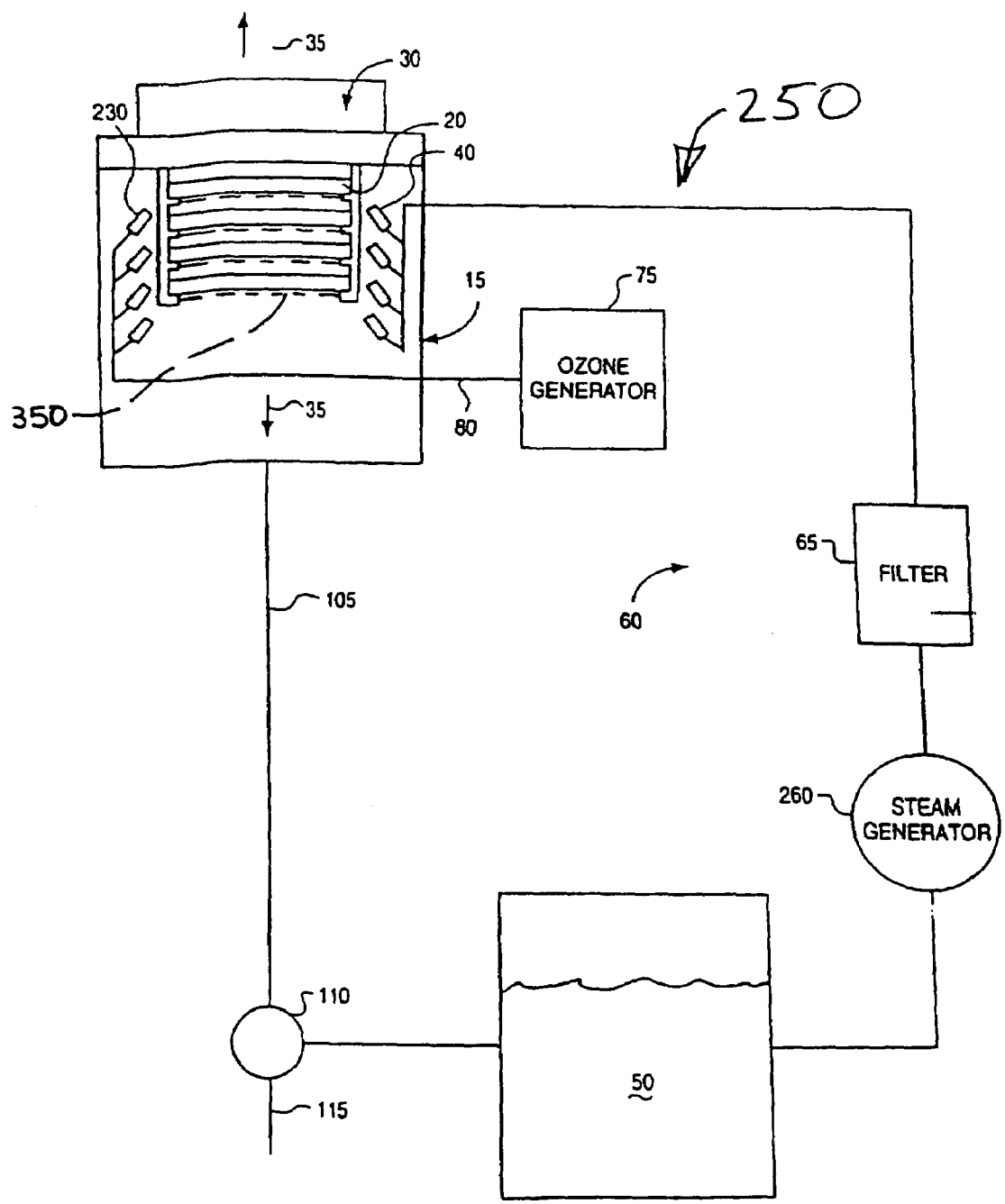
FIG. 5 is a diagram of an embodiment of an apparatus for cleaning a workpiece in which pressurized steam and ozone are provided in a pressurized chamber.

In FIG. 5, a system 250 has a steam boiler 260 that supplies steam under pressure to the process chamber 15. The chamber 15 is preferably sealed to thereby form a pressurized atmosphere. Steam or saturated steam at 100 or 110° C. up to about !50 or 200° C., typically about 110–130 or 140° C. is generated by the steam boiler 260 and supplied to the chamber 15. Pressure in the chamber generally ranges from 16, 18 or 20 up to about 90 psia, usually in the range of about 20–70; 25–50; and 30–45 psia, with 35 psia typical during the wafer processing. Ozone may be directly injected into the chamber 15 as shown, and/or may be injected into the path 60 for concurrent supply with the steam. With this system, wafer surface temperatures in excess of 100° C. can be achieved, thereby further accelerating the chemical reactions and reducing required process times. The steam generator in FIG. 5 may be replaced with a heater(s) as shown in FIGS. 1–4. While FIGS. 4 and 5 show the liquid and ozone delivered via separate nozzles 40, they may also be delivered from the same nozzles, using appropriate valves.

In the case of oxidizing and removing organic contamination, conventional aqueous ozone processes show a strip rate on photoresist (a hydrocarbon film) of around 200–700 angstroms per minute. In the liquid layer controlled system of the disclosed processes, the rate is accelerated to 2500 to 8800 angstroms per minute in a spray controlled liquid layer, or higher when the liquid layer is generated and controlled using steam.

Figure 6:
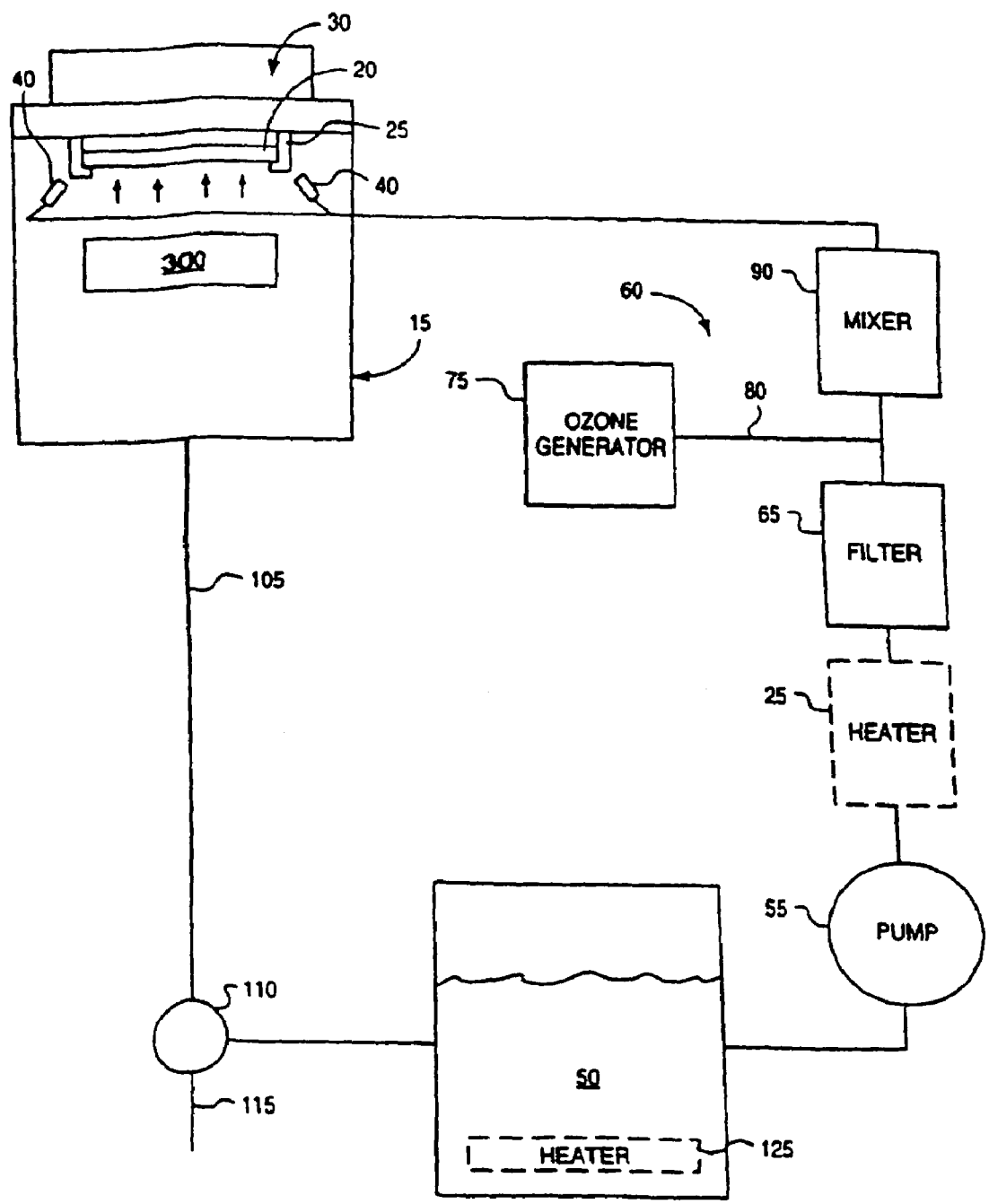
FIG. 6 is a diagram of an embodiment of an apparatus for cleaning a workpiece in which an ultra violet lamp is used to enhance the kinetic reactions at the surface of the workpiece.

In the system shown in FIG. 6, an ultra-violet or infrared lamp 300 is used to irradiate the surface of the wafer 20 during processing, to enhance the reaction kinetics. Although this irradiation technique may be applicable to batch wafer processing, it is more easily and economically implemented for single wafer processing where the wafer is more easily completely exposed to the UV radiation. Megasonic or ultrasonic nozzles 40 may also be used. FIG. 6 shows single wafer processing. However, the embodiments of FIGS. 1–6 may each be used with single wafer processing, or with batch processing. In addition, use of base additives to improve cleaning or to reduce corrosion, as described above, can be performed in any of the systems shown in FIGS. 1–6, or in immersion systems.

In each of the systems shown in FIGS. 1–6, the ozone gas may be separately sprayed, jetted, entrained in a carrying liquid or gas, or otherwise introduced as a gas into the process chamber, where it can diffuse, impact or displace through, the liquid layer on the wafer. The liquid may be heated and sprayed or otherwise applied to the wafer, without ozone injected into the liquid before the liquid is applied to the wafer. Alternatively, the ozone may be injected into the liquid, and then the ozone containing liquid applied to the wafer. If the liquid is heated, the heating is better performed before the ozone is injected into the liquid to reduce the amount of ozone breakdown in the liquid during heating. Typically, due to the larger amounts of ozone desired to be injected into the liquid and the low solubility of the ozone gas in the heated liquid the liquid will contain some dissolved ozone, and may also contain ozone bubbles. It is also possible to use both ozone gas injection directly into the process chamber, and to also introduce ozone into the liquid before the liquid is delivered into the process chamber.

Thus, novel method and systems have been shown and described. Various changes and substitutions can of course be made, without departing from the spirit and scope of the invention. The invention, therefore, should not be limited, except by the following claims and their equivalents.

The invention claimed is:

1. A method for cleaning at least one workpiece, comprising:
   placing the workpiece into a chamber;
   spraying a liquid onto the workpiece, with the liquid including water and ammonium hydroxide, and with the liquid forming a liquid layer on the workpiece;
   controlling the thickness of the liquid layer by one or more of rotating the workpiece, adding a surfactant, or controlling the flow rate of the liquid; and
   providing ozone in the chamber, with at least some of the ozone diffusing through the liquid layer and chemically reacting with a contaminant on the workpiece, to clean the workpiece.

2. The method of claim 1 with the liquid having a concentration of water to ammonium hydroxide ranging from about 1500:1 to 3000:1.

3. The method of claim 1 further comprising heating one or more of the liquid, the workpiece, and the chamber.

4. The method of claim 1 with the liquid layer having a thickness of about 1–100 microns.

5. The method of claim 1 with liquid at about ambient temperature.

6. A method for removing photoresist from a surface of a workpiece, comprising:
   placing the workpiece into a chamber;
   closing the chamber, and providing ozone gas into the chamber;
   spraying a liquid at a controlled rate onto a surface of the workpiece having a coating of photoresist, with the liquid including water and a base;
   forming the liquid into a layer on the workpiece;
   controlling the thickness of the liquid layer; and
   providing ozone to the liquid layer, with the ozone oxidizing the photoresist in the presence of the liquid, and removing the photoresist.

7. The method of claim 6 further comprising heating the liquid to about 30–100° C.

8. The method of claim 6 where the photoresist is a negative photoresist.

9. The method of claim 6 wherein the workpiece has one or more metal features, and with the liquid at about 15–29° C. to avoid substantial corrosion of the metal features.

10. The method of claim 6 where the base comprises tetra-methyl ammonium hydroxide, KOH or NaOH.

11. The method of claim 6 where the liquid comprises water and the base comprises ammonium hydroxide and where the ratio of water to ammonium hydroxide ranges from about 1000:1 to about 5000:1.

12. The method of claim 6 wherein the workpiece has a NiCr film.

13. The method of claim 6 wherein the ozone gas is provided into the chamber separately from the liquid.

14. A method for reducing corrosion of metal features on a wafer during cleaning of the wafer, comprising:

placing the workpiece into a chamber;
spinning the wafer;
contacting the spinning wafer with a liquid including water and ammonium hydroxide, with the liquid forming into a liquid layer on the wafer;
controlling the thickness of the liquid layer;
providing ozone into the liquid layer, with the ozone oxidizing a contaminant on the wafer; and
with the ammonium hydroxide acting to reduce corrosion of the metal features, in the presence of water and ozone.

15. The method of claim 14 further including heating the liquid to 30–100° C.

16. The method of claim 14 with the concentration of ammonium hydroxide in the liquid ranging from about 1:20 to about 1:250.

17. The method of claim 14 wherein at least one of the metal features comprises NiCr.

18. The method of claim 14 wherein at least one of the metal features comprises silver.

19. The method of claim 14 wherein the wafer includes one or more MEMS devices.

* * * * *